United States Patent
Matsubara et al.

(10) Patent No.: US 6,891,737 B1
(45) Date of Patent: May 10, 2005

(54) INVERTER DEVICE FOR AC MOTOR CONTROL

(75) Inventors: Shunsuke Matsubara, Yamanashi (JP); Yuuichi Yamada, Yamanashi (JP); Shinichi Horikoshi, Yamanashi (JP); Kazuyuki Sugiyama, Yamanashi (JP)

(73) Assignee: Fanuc Ltd., Yamanashi (JP)

( * ) Notice: Subject to any disclaimer, the term of this patent is extended or adjusted under 35 U.S.C. 154(b) by 149 days.

(21) Appl. No.: 10/340,678

(22) Filed: Jan. 13, 2003

(30) Foreign Application Priority Data

Mar. 14, 2002 (JP) ...................................... 2002-070031

(51) Int. Cl.$^7$ ............................................. H02M 7/48
(52) U.S. Cl. .......................................... 363/95; 363/98
(58) Field of Search .................................... 363/95, 98

(56) References Cited

U.S. PATENT DOCUMENTS 4,370,702 A * 1/1983 Shuey et al. ................... 363/42
5,282,125 A * 1/1994 Dhyanchand et al. ......... 363/49

FOREIGN PATENT DOCUMENTS

| JP | 05-091780 | 4/1993 | ............ H02P/5/408 |
| JP | 05-328733 | 12/1993 | ............ H02M/7/48 |
| JP | 07-170799 | 7/1995 | ............ H02P/21/00 |
| JP | 11-032499 | 2/1999 | ............ H02P/7/63 |

* cited by examiner

*Primary Examiner*—Jeffrey Sterrett
(74) *Attorney, Agent, or Firm*—Staas & Halsey LLP

(57) ABSTRACT

An inverter apparatus is provided with first and second current detectors for detecting the current of two arbitrary phases and further with first and second A/D converters, and they are integrated into one unit. It furthermore stores, in a storage device, a compensation value for compensating for an unbalance between gains of the first current detector and the first A/D converter, and gains of the second current detector and the second A/D converter. By multiplying the detected current value of either one of the detected phases by this compensation value, it equalizes the current feedback gains for both phases.

9 Claims, 2 Drawing Sheets

INVERTER DEVICE FOR AC MOTOR CONTROL

BACKGROUND OF THE INVENTION

1. Field of the Invention

The present invention relates to improving the inverter apparatus used to control an AC motor.

2. Description of the Related Art

The inverter apparatus which drives an AC motor detects the currents for the respective phases output from the inverter apparatus to the AC motor, then feeds them back to effect feedback control for current. With the inverter apparatus that is mounted to a three-phase AC motor, for example, current detectors are incorporated to detect the respective currents of two phases and thereby perform feedback control for the respective current phases.

In the above case, if a difference in gain occurs between the current detectors, torque ripple will occur, resulting in unstable rotation of the AC motor. The conventional way to deal with this problem is to adjust the gain unbalance for each inverter apparatus before the apparatus is turned on or while it is operating, either manually or automatically, based on values detected by the current detectors of the inverter apparatus, or data on motor speed, position and torque. Refer to Japanese Patent Application Laid-open No. H6-121569 for an example.

With the conventional technology, in order to compensate for gain unbalance in the current detectors of the inverter apparatus, either before the inverter is turned on, or while it is operating, measures need to be taken, such as rotating the motor or allowing the output current in the inverter apparatus to flow. Also, the gain unbalance needs to be readjusted when the inverter apparatus is replaced and the replaced inverter apparatus is connected to a motor or current detectors.

SUMMARY OF THE INVENTION

An object of the present invention is, for solving the problems of the conventional technique, to provide an inverter apparatus that eliminates the need for making adjustments while the inverter apparatus is operating, or while it is being mounted to a motor, and to eliminate the need to readjust the gain unbalance when the inverter apparatus is replaced.

According to the present invention, an inverter apparatus for AC motor control comprises electrical current detection means for detecting electrical current for each phase of at least two phases, storage means for storing compensation data for compensating for gain unbalance occurring in the current detection means, and compensation means for compensating for gain unbalance based on the compensation data stored in the storage means when the motor is driven.

With this inverter apparatus, adjustment of gain unbalance while the inverter apparatus is operating, and adjustment of gain unbalance once the inverter apparatus has been incorporated into a motor and replaced become unnecessary.

Compensation data for compensating for gain unbalance may be acquired based on the value fed back from respective current detector means, mounted on the inverter apparatus, to the current control circuit of the inverter apparatus, and stored in the storage means.

Also, this compensation data may be either the ratio of gains or gains themselves of current detection means for at least two phases, or else, may be the ratio of differences in the output values of the current detection circuit for each phase that is obtained when at least two patterns of output current are caused to flow in a state where the same current flows to the two-phase outputs.

With the present invention, as current detection means for detecting at least two phases are integrally incorporated in an inverter apparatus, the gain unbalance in the current detection means can be acquired at the time the inverter apparatus is manufactured, and as compensation data for compensating for the gain unbalance is preset and stored in the storage means, the need for performing adjustments for gain unbalance after the inverter apparatus is mounted to the motor is eliminated, allowing the inverter apparatus to be put into operation immediately. Also, the need for adjusting the gain unbalance at the time the inverter apparatus is replaced is eliminated, hence, the process of mounting the inverter apparatus to a motor at a manufacturing site becomes much easier. Furthermore, the compensation data to be stored in storage means for compensating for gain unbalance can be acquired based on the electrical current feedback value that is fed back to the current control circuit, so that more accurate data is obtained.

DESCRIPTION OF THE PREFERRED EMBODIMENTS

Figure 1:
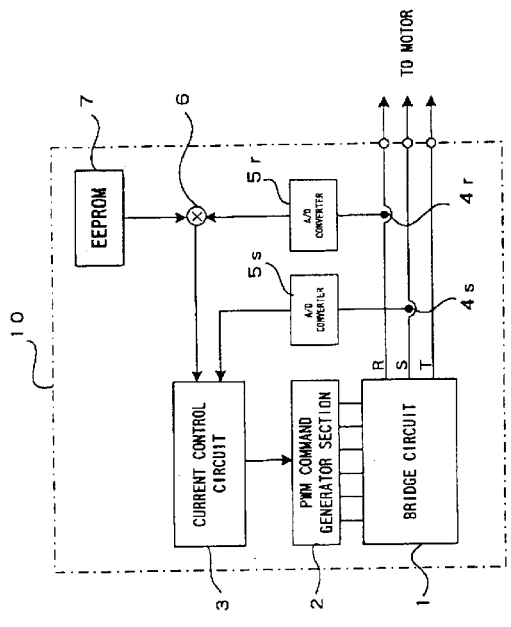
FIG. 1 is a block diagram illustrating an embodiment of an inverter apparatus according to the present invention.

FIG. 1 is a block diagram illustrating an embodiment of an inverter apparatus used for controlling an AC motor according to the present invention. As shown in FIG. 1, an inverter apparatus 10 of this embodiment comprises a bridge circuit 1, which constitutes the inverter itself, includes switching elements such as transistors or the like and diodes, etc.; a PWM command generator section 2 which generates a PWM (pulse-width modulations command for driving and controlling the above-mentioned bridge circuit 1; a current control circuit 3 which performs feedback control of electrical current based on a current command (torque command) from a host control device and a current feedback value and outputs a command signal to the PWM command generator section 2; current detectors 4r and 4s (which are designed to detect currents in R and S phases in this embodiment); A/D converters 5r and 5s; a multiplier 6, and an EEPROM 7.

The present invention is characterized in that, as shown in FIG. 1, current detection means made up of the current detectors 4r and 4s and the A/D converters 5r and 5s are pre-incorporated in the inverter apparatus 10, along with the multiplier 6 and the EEPROM 7.

The outputs of the inverter apparatus 10, i.e., the outputs of R, S and T phases of the bridge circuit 1, are connected to the AC motor. Based on the current command (torque command) from the host control device (not illustrated) and the current feedback values that are detected by the current detector currents 4r and 4s and converted into the digital signals by the A/D converters 5r and 5s, the current control circuit 3 performs feedback control of current and outputs a command signal to the PWM command generator section 2. Based on this command signal, the PWM command generator 2 outputs the PWM command to turn ON/OFF the switching element of the bridge circuit 1 for controlling the bridge circuit 1.

If the gains of the two current detection means are equal (gains including both the gain of the current detectors and the gain of the A/D converters are referred to as gains of current detection means), no problems will occur. However, as these gains normally differ, the multiplier 6 and the EEPROM 7 are incorporated to adjust for gain unbalance. With these means, the gains of the R phase and S phase current detection means (current feedback gain) are adjusted so as to be equalized. In this embodiment, the current feedback signal for R phase is multiplied by a compensation value H that is stored in the EEPROM 7 so that the gain of current detection means for R phase (4r, 5r) (that is a current feedback gain, including gains of the current detector 4r and the A/D converter 5r) is adjusted so as to equal the gain of the current detection means for S phase (4s, 5s) (including gains of the current detector 4s and the A/D converter 5s).

Conventionally, as a ROM for storing gain unbalance is not built into the inverter apparatus, gain unbalance adjustments for the current detectors can only be performed after the inverter apparatus and current detectors have been mounted to the motor. Accordingly, adjustments are made by operating the inverter apparatus and while the motor is being driven, or by locking the motor rotation before the motor is driven and causing current to flow through the inverter apparatus to detect gain unbalance in the current detection means.

With the present invention, as the inverter apparatus is integrated with the current detectors 4r and 4s and A/D converters 5r and 5s, the characteristics of the current detection means are predetermined, and the gain unbalance of the current detection means (current feedback) is also predetermined. Therefore, after the inverter apparatus 10 is assembled, the compensation value H can be stored in EEPROM 7 by measuring the gain unbalance for this current detection means.

Consequently, it is no longer necessary to adjust the gain unbalance at a site where the inverter apparatus is mounted on the motor; also such adjustments are not required after the inverter apparatus is replaced, which simplifies the assembly of a motor control apparatus.

Figure 2:
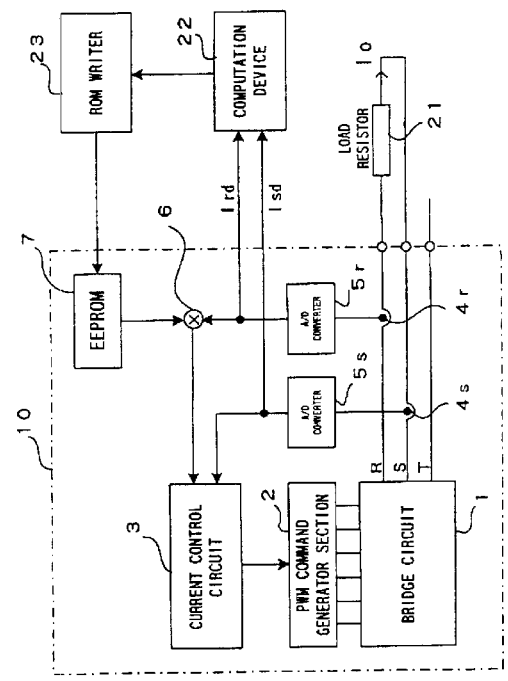
FIG. 2 is a figure illustrating the method of measuring gain unbalance and the method for setting the compensation value in the embodiment.

FIG. 2 is a diagram explaining the measurement of gain unbalance by this current detection means and the writing of the compensation value H for adjusting the gain unbalance in the EEPROM 7.

Before the inverter apparatus 10 is mounted on a motor, that is, when the inverter apparatus 10 is assembled (before shipment, for example), the output terminals for the two phases for current detection are short-circuited by load resistor 21. In this embodiment, as current detectors 4r and 4s are mounted in R and S phases, a load resister 21 is connected to the output terminals of the R and S phases. Also, the output of the A/D converters 5r and 5s is connected to a computation device 22.

Direct current $I_o$ is allowed to flow between the R and S phases. For example, $I_o$=A ampere is allowed to flow, then, the size and code are varied and $I_o$=−B ampere is allowed to flow. In the above case, when A ampere of current is allowed to flow at this point, the value detected by the current detector 4r is assumed as $I_{rd1}$, and the value detected by the current detector 4s is assumed as $I_{sd2}$. Also, when −B ampere of current is allowed to flow, the value detected by the current detector 4r is assumed as $I_{rd2}$ and the value detected by the current detector 4s is assumed as $I_{sd2}$.

Figure 3:
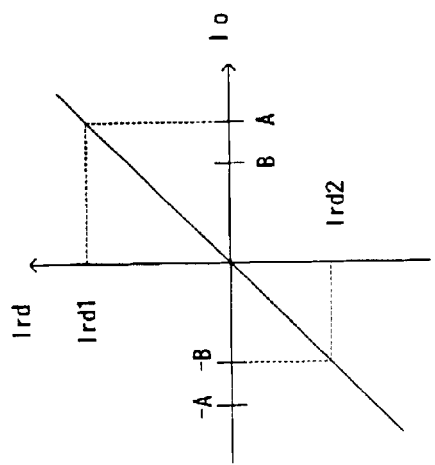
FIG. 3 is a figure illustrating the results of detection of R phase using the method for measuring gain unbalance in the embodiment.
Figure 4:
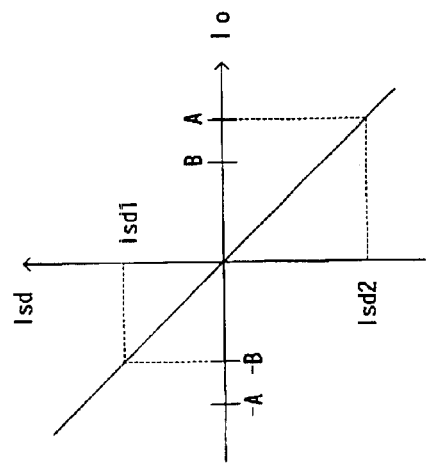
FIG. 4 is a figure illustrating the results of detection of S phase using the method for measuring gain unbalance in the embodiment.

As a result, as shown in FIG. 3, the value detected by the current detector 4r changes from $I_{rd2}$ to $I_{rd1}$, while the current flowing in the R phase changes from −B ampere to A ampere, thus, gain Gr of the current detector 4r can be acquired as the inclination of the straight line which connects the point (−B, $I_{rd2}$) and the point (A, $I_{rd1}$) in FIG. 3.

$$Gr=(I_{rd1}-I_{rd2})/(A+B) \quad (1)$$

Similarly, while the current flowing in the S phase changes from −B ampere to A ampere, the value detected by the current detector 4s changes from $I_{sd1}$ to $I_{sd2}$, and gain Gs of the current detector 4s can be acquired as the inclination of the straight line connecting the point (−B, $I_{sd1}$) and the point (A, $I_{sd2}$).

$$Gs=(I_{sd1}-I_{sd2})/(A+B) \quad (2)$$

Gain unbalance Gub can be acquired by the following equation (3) based on equations (1) and (2) above.

$$Gub=(Gr/Gs)-1=[(I_{rd1}I_{rd2})/(I_{sd1}-I_{sd2})]-1 \quad (3)$$

Also, a goal of this embodiment is to eliminate the gain unbalance by multiplying the detected current value of the R phase by a compensation value H, the compensation value H can be acquired as:

$$H = 1/(Gub+1) \quad (4)$$
$$= (Gs/Gr)$$
$$= 1/[(I_{rd1} - I_{rd2})/(I_{sd1} - I_{sd2})]$$

Hence, $I_{rd1}, I_{rd2}, I_{sd1}, I_{sd2}$ detected by current detectors 4r and 4s are input to the computation device 22 via the A/D converters 5r and 5s, and computations are made by the computation device 22 according to the above equation (4) to acquire the compensation value H, then this value is written in the EEPROM 7 of the inverter apparatus 10 by a ROM writer 23.

As mentioned above, the current detection means (current detectors 4r, 4s, AD converters 5r, 5s) for two phases are incorporated into the inverter apparatus 10, and the data H for adjusting the gain unbalance for this current detection means are stored, so that this inverter apparatus 10 is integrated as one unit for adjusting gain unbalance, the inverter operation is immediately enabled after the inverter apparatus 10 is incorporated into a motor.

In this case, when the current I flows in the S phase, for example, the detected current value $I_{sd}$, that is detected by the current detector 4s and converted into a digital signal by the A/D converter 5s, then fed back to the current control circuit 3, is expressed as:

$$I_{sd}=Gs \cdot I$$

Similarly, when the current I flows in the R phase, the detected current value $I_{rd}$, that is detected by the current detector 4r and converted into a digital signal by the A/D converter 5r, then multiplied by the compensation value H by the multiplier 6, and fed back to the current control circuit 3, is expressed as:

$$I_{rd}=Gr \cdot I \cdot H=Gr \cdot I(Gs/Gr)=Gs \cdot I$$

When currents of the same size are detected by current detection means for R and S phases, the detected current values fed back to the current control circuit 3 are of the same size, and the gain unbalance has been adjusted.

As the method of acquiring the gain unbalance Gub and compensation value H mentioned above; A ampere and B ampere of current are allowed to flow, with the size and direction of the current changed. Based on the current value detected at this point, the gain unbalance Gub and the compensation value H are acquired. However, this method is for eliminating current offset, and if there is no offset, it is possible to simply allow a specified amount of current to flow so as to detect the gain of the respective current detection means based on the detected current value.

Also, gains of the current detectors 4r and 4s and the A/D converters 5r and 5s can be acquired separately in order to obtain the gain unbalance. However, with the present invention, current detection means including the current detectors 4r, 4s and the A/D converters 5r, 5s, etc. are built into the inverter, and in the state where these are built in, gain unbalance is acquired based on the detected current value that is fed back to the current control circuit, whereby the gain unbalance for current feedback gain, including that of the current detection means, can be determined more accurately.

Also, as the compensation value H is stored in a non-volatile memory which can be overwritten such as EEPROM7, when the gain unbalance changes, the compensation value H can also be changed.

The current control circuit 3 is typically constituted by a processor and current control is performed by software. In this case, software is used by the current control circuit 3 to perform the processing for the multiplier 6. Also, because software processing is used, the data stored in an overwriteable non-volatile memory such as EEPROM 7 can be either the compensation value H, or the gain unbalance Gub, or even the gains or gain ratio of respective current detection means.

What is claimed is:

1. An inverter apparatus for AC motor control comprising:
    electrical current detection means for detecting electrical current for each phase of at least two phases;
    storage means for storing compensation data for compensating for gain unbalance for each respective electrical current detection means; and
    means for compensating for the gain unbalance based on the compensation data stored in the storage means at the time the motor is driven.

2. The inverter apparatus for AC motor control according to claim 1, wherein the compensation data for compensating for the gain unbalance are sought based on the value fed back to a current control circuit of the inverter apparatus from each respective current detection means which are mounted on the inverter apparatus, and the compensation data are stored on the storage means.

3. The inverter apparatus for AC motor control according to claim 1, wherein the compensation data for compensating for the gain unbalance are stored on the storage means before the inverter apparatus is mounted to the motor.

4. The inverter apparatus for AC motor control according to claim 1, wherein the compensation data for compensating for gain unbalance stored on the storage means are the ratio of gains of the current detection means for at least two phases.

5. The inverter apparatus for AC motor control according to claim 1, wherein the compensation data for compensating for gain unbalance stored on the storage means are the gains of the electrical current detection means for at least two phases.

6. The inverter apparatus for AC motor control according to claim 1, wherein the compensation data for compensating for gain unbalance stored on the storage means are the ratio of differences of the output values from each respective electrical current detection means of the respective phases obtained by allowing the output current of at least two patterns to flow in a state where the same current flows for the two-phase output.

7. An inverter apparatus for AC motor control comprising:
    an inverter circuit that includes a plurality of switching elements;
    a PWM command generator section that generates PWM commands for drive control of the inverter circuit;
    a current control circuit that outputs command signals to the PWM command generator section;
    first and second current detection means for detecting the currents of two arbitrary phases from among the currents of three phases output from the inverter circuit, the current control circuit generating a command signal to the PWM command generator section based on a current command received from a host control device and the current feedback value detected by the first and second current detection means; and
    a multiplier circuit between the first circuit detection means and the current control circuit, that multiplies the value which is fed back to the current control circuit by the ratio of the current feedback gain of the second current detection means to the current feedback gain of the first current detection means.

8. An inverter apparatus for AC motor control, comprising:
    electrical current detectors detecting electrical current for each phase of at least two phases;
    a storage unit storing compensation data for compensating for gain unbalance for each respective electrical current detector; and
    a gain unbalance compensating unit compensating for the gain unbalance based on the compensation data stored in the storage unit at the time the motor is driven.

9. An inverter apparatus for AC motor control, comprising:
    an inverter circuit that includes a plurality of switching elements;
    a PWM command generator section that generates PWM commands for drive control of the inverter circuit;
    a current control circuit that outputs command signals to the PWM command generator section;
    a first current detector and a second current detector that respectively detect the currents of two arbitrary phases from among the currents of three phases output from the inverter circuit, the current control circuit generating a command signal to the PWM command generator section based on a current command received from a host control device and the current feedback value detected by the first current detector and the second current detector; and
    a multiplier circuit between the first circuit detector and the current control circuit, that multiplies the value that is fed back to the current control circuit by the ratio of the current feedback gain of the second current detector to the current feedback gain of the first current detector.

* * * * *

UNITED STATES PATENT AND TRADEMARK OFFICE
CERTIFICATE OF CORRECTION

PATENT NO. : 6,891,737 B1
DATED : May 10, 2005
INVENTOR(S) : Shunsuke Matsubara et al.

It is certified that error appears in the above-identified patent and that said Letters Patent is hereby corrected as shown below:

Column 2,
Line 48, delete "modulations" and insert -- modulation --;

Column 4,
Line 5, delete "$I_{sd2}$" and insert -- $I_{sd1}$ --;
Line 26, (Equation 3), after "=[" delete "$(I_{rd1}I_{rd2})$" and insert -- $(I_{rd1} - I_{rd2})$ --;
Line 38, after "$I_{sd1}$," insert -- and --;

Column 5,
Line 6, after "above" delete ";" and insert -- , --;
Line 27, delete "EEPROM7" and insert -- EEPROM 7 --.

Signed and Sealed this

Twenty-eighth Day of February, 2006

JON W. DUDAS
*Director of the United States Patent and Trademark Office*